United States Patent [19]
Barr et al.

[11] 4,036,665
[45] July 19, 1977

[54] THERMOPILE FOR MICROWATT THERMOELECTRIC GENERATOR

[75] Inventors: Harold N. Barr; Warren Charles Lyon, both of Baltimore; Thomas S. Bustard, Elicott City, all of Md.

[73] Assignee: Nuclear Battery Corporation, Columbia, Md.

[21] Appl. No.: 488,970

[22] Filed: July 16, 1974

[51] Int. Cl.² .................. H01L 35/04; H01L 35/16
[52] U.S. Cl. ................................. 136/202; 136/225
[58] Field of Search ............................. 136/225, 202

[56] References Cited
U.S. PATENT DOCUMENTS

| 3,305,393 | 2/1967 | Breckenridge | 136/225 |
| 3,483,045 | 12/1969 | Villers | 136/225 |
| 3,535,523 | 10/1970 | Wunderman et al. | 136/225 UX |
| 3,554,815 | 1/1971 | Osborn | 136/225 |
| 3,715,288 | 2/1973 | Risgin | 136/225 UX |
| 3,754,999 | 8/1973 | Merges | 136/202 |
| 3,830,664 | 8/1974 | Winkler et al. | 136/202 |

Primary Examiner—Nelson Moskowitz
Attorney, Agent, or Firm—Fleit & Jacobson

[57] ABSTRACT

A thermopile for a microwatt thermoelectric generator suitable for implanting in the body. The thermopile comprises a series of semiconductive thermoelectric elements such as P- and N-type bismuth telluride deposited as a thin film on a substrate such as a polyimide by sputtering. After the thin film is deposited, the thermopile is heat treated to anneal the bismuth telluride. The thermopile is then ready for insertion in a microwatt thermoelectric generator.

11 Claims, 4 Drawing Figures

THERMOPILE FOR MICROWATT THERMOELECTRIC GENERATOR

CROSS-REFERENCE TO RELATED APPLICATION

The thermopile of the present invention is useable in a microwatt thermoelectric generator of the type disclosed in commonly assigned application Ser. No. 189,842, filed Oct. 18, 1971, for MICROWATT THERMOELECTRIC GENERATORS now abandoned.

BACKGROUND OF THE INVENTION

Devices such as cardiac pacemakers have been developed over the past several years for implanting in the body to aid or support a body function. These devices require a source of energy which must also be suitable for implanting in the body. In the past, chemical batteries have been employed for this purpose. However, chemical batteries have limited life times and so are not suitable for most applications because of the necessity for surgical intervention every few years to replace the power source.

The commonly assigned application cross-referenced above discloses an improved power source for implanting in the body comprising a microwatt thermoelectric generator utilizing a thermopile and nuclear fuel heat source. The thermopile is comprised of semiconductor thermoelectric elements, such as P- and N-type bismuth telluride elements, stacked together in a parallel array and separated by thin polyimide films. The semiconductor thermoelectric elements are approximately 15 mils square and about ⅜ inch long with a stack or array including about 36 elements. The elements are connected together by shoes which are alloyed into the end faces of the elements. With this arrangement, the microwatt thermoelectric generator is capable of an electric power output of 300 to 400 microwatts at approximately 0.3 volts using a nuclear power source equivalent to approximately 50 milliwatts of thermal energy which is generally equivalent to 1/10 gram of a suitable form of plutonium.

The microwatt thermoelectric general construction disclosed in the commonly assigned application cross-referenced above is a highly advantageous one. However, because of design constraints including size, it is difficult to place a sufficient number of semiconductor elements in the thermopile array to obtain the desired power output. Furthermore, the thermopile is comprised of semiconductor materials which are inherently brittle and exhibit low strength compared to metals when subjected to tensile or shearing loads. Tensile and shear loading tends to break or crack the semiconductor elements and/or electrical connectors causing electrical discontinuity and failure. Accordingly, one of the features of the thermopile mount disclosed in the commonly assigned application cross-referenced above is the provision of a support harness to place the thermoelectric elements under compression even under loading conditions which would otherwise result in tension or shear stresses.

SUMMARY OF THE INVENTION

An object of the present invention is to provide an improved thermopile for a microwatt thermoelectric generator suitable for implanting in the body.

A further object of the present invention is to provide an improved thermopile which is small in size yet capable of generating more voltage than conventional thermopiles used in microwatt thermoelectric generators.

Still another object of the present invention is to provide an improved thermopile for use in a microwatt thermoelectric generator without the necessity for placing the thermopile under compressive forces.

Yet another object of the present invention is to provide an improved and less expensive process for forming a thermopile.

These and other objects of the present invention will become more apparent upon reading the undergoing specification and claims taken in conjunction with the accompanying drawings.

DESCRIPTION OF THE PREFERRED EMBODIMENTS

Figure 1:
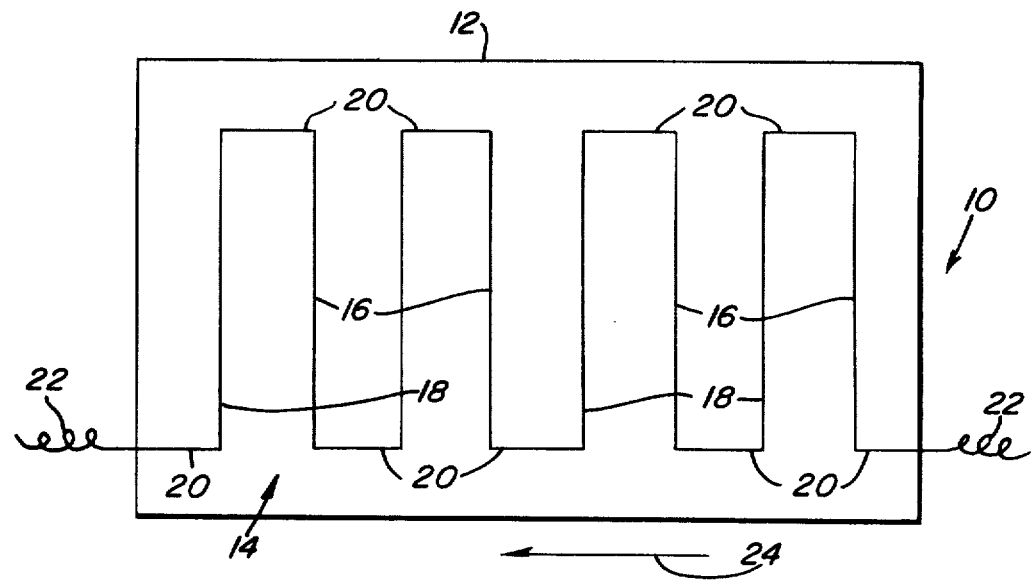
FIG. 1 is a schematic top plan view of the thermopile of the present invention.

Referring to FIG. 1, the thermopile assembly 10 of the present invention comprises a substrate 12 on which is deposited a series of semiconductor thermoelectric elements 14. Substrate 12 can be formed from any material which is stable at the temperatures to which the substrate will be exposed and which will not react with its environment during use. Substrate 12 preferably comprises a thin flexible plastic or the like. The preferred plastic substrate is a 0.25 to 5 mil thick polyimide film such as obtained commercially under the trade name KAPTON from E. I. du Pont de Nemours and Company. Substrate 12 is rectangular in shape as illustrated and is typically about 0.6 inches wide and 20 inches long. Semiconductor thermoelectric elements 14 preferably comprise P- and N- type bismuth telluride strips 16 and 18, respectively. The P- type dopants typically employed are excess tellurium and selenium and the N- type dopants are cuprous bromide (Cu B), silver iodide (Ag I), antimony iodide (Sb $I_3$) and bismuth iodide (Bi $I_3$). The semiconductor thermoelectric elements 14 are interconnected by shoes 20 typically comprising nickel strips. The P- and N- type bismuth telluride strips are approximately 0.1 to 1.0 mil thick and 5 to 50 mil wide. The shoes or nickel strips are of a similar thickness and width. Thermopile assembly 10 further comprises leads 22 formed from nickel or other metals such as gold, aluminum, molybdenum and tungsten which are attached to the shoes 20 which form the ends of the thermopile. The thermopile assembly 10 illustrated in FIG. 1 is rolled up in the direction of arrow 24 to form a pencil thin thermopile assembly for use in a microwatt thermoelectric generator.

Figure 2:
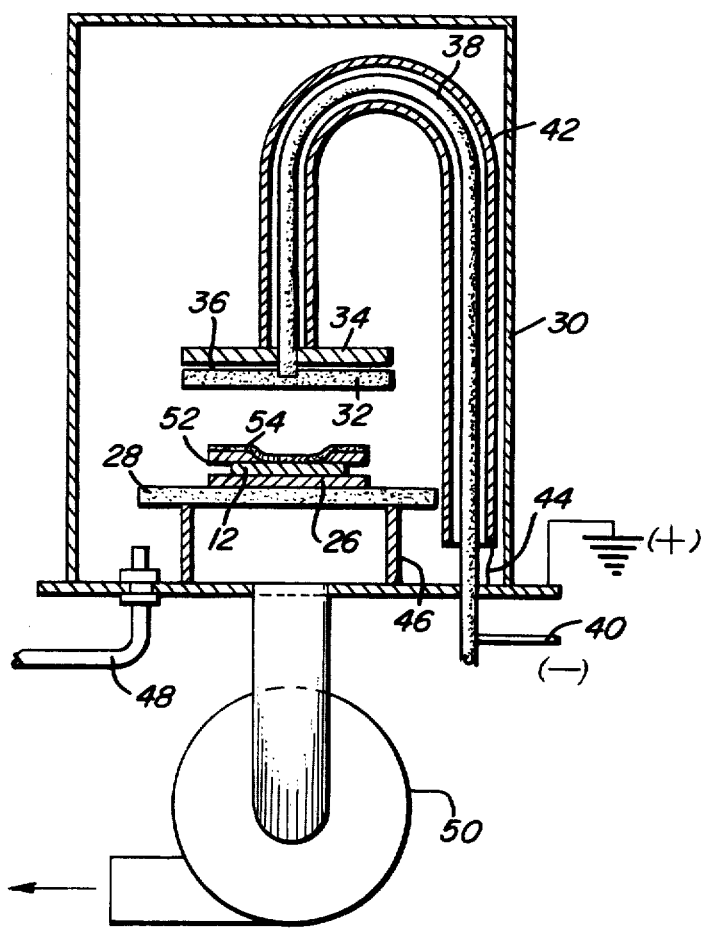
FIG. 2 is a schematic vertical, cross-sectional view of the sputtering apparatus used in forming the thermopile of the present invention.

Referring now to FIG. 2, the method of forming thermopile assembly 10 of FIG. 1 will now be described. Substrate 12 is placed on substrate holder 26 which is mounted on anode 28 in housing 30. Also mounted in housing 30 and spaced from anode 28 is cathode 32. Cathode 32 is backed by plate 34 made from quartz or the like and spaced therefrom by spacer 36.

Cathode 32 is connected by high voltage lead 38 to high voltage source 40 which is positioned outside of housing 30. High voltage lead 38 is shielded by shield 42 which is grounded such as by ground strap 44. Anode 28 is held in position by legs 46 and is also at ground potential. The processing assembly further includes inert gas inlet 48. The inside of housing 30 is connected by vacuum pump 50 for evacuating the housing. A single mask 52 is shown in FIG. 2 however it will be readily understood that a plurality of masks will be used to form the semiconductor thermoelectric elements 14 as shown in FIG. 1.

In operation, anode 28 and substrate 12 are grounded as previously described and a sputtering voltage is applied to cathode 32. Housing 30 is evacuated and after sputtering gas is admitted into housing 30 through inlet 48 deposition commences forming deposited film 54. More specifically, the high negative voltage above 500 volts on cathode or target 32 causes "cold cathode" emission. The electron flow in the area between anode 28 and cathode 32 causes ionization of the inert gas and creates a plasma. The inert or sputtering gas is typically argon at 5 to 10 micron pressure. Sputtering occurs as the positively charged inert gas ions impinge onto the negatively charged cathode 32 and dislodge atoms of the target. These atoms leave the surface as sputtered atoms and are deposited on substrate 12 forming deposited thin film 54.

Before placing substrate 12 in housing 30, the polyimide film which has a rough surface is polished by sand blasting and the use of steel wool. In the first sputtering sequence a first mask 52 is placed on substrate 10 and a nickel cathode 32 employed to deposit shoes 20. Thereafter, a second mask 52 is substituted for the first mask and a P- type bismuth telluride cathode is substituted for the nickel cathode. The P- type bismuth telluride strips 16 in FIG. 1 are then formed by sputtering. Lastly, a third mask 52 is substituted for the second mask 52 and an N- type bismuth telluride cathode is substituted for the P- type bismuth telluride cathode so that strips 18 can be deposited by sputtering. After substrate 12 having semiconductor thermoelectric elements 14 deposited thereon by sputtering is removed from housing 30, the thermoelectric assembly is rolled up in the direction of arrow 24 as shown in FIG. 1 and then heat treated at a temperature of about 250° to 450° C for about 2 to 18 hours to anneal the bismuth telluride. The heat treatment develops the crystallinity of the deposited films which are amorphous as deposited as well as improves the Seebeck and lowers the electrical resistivities of the films.

Figure 3:
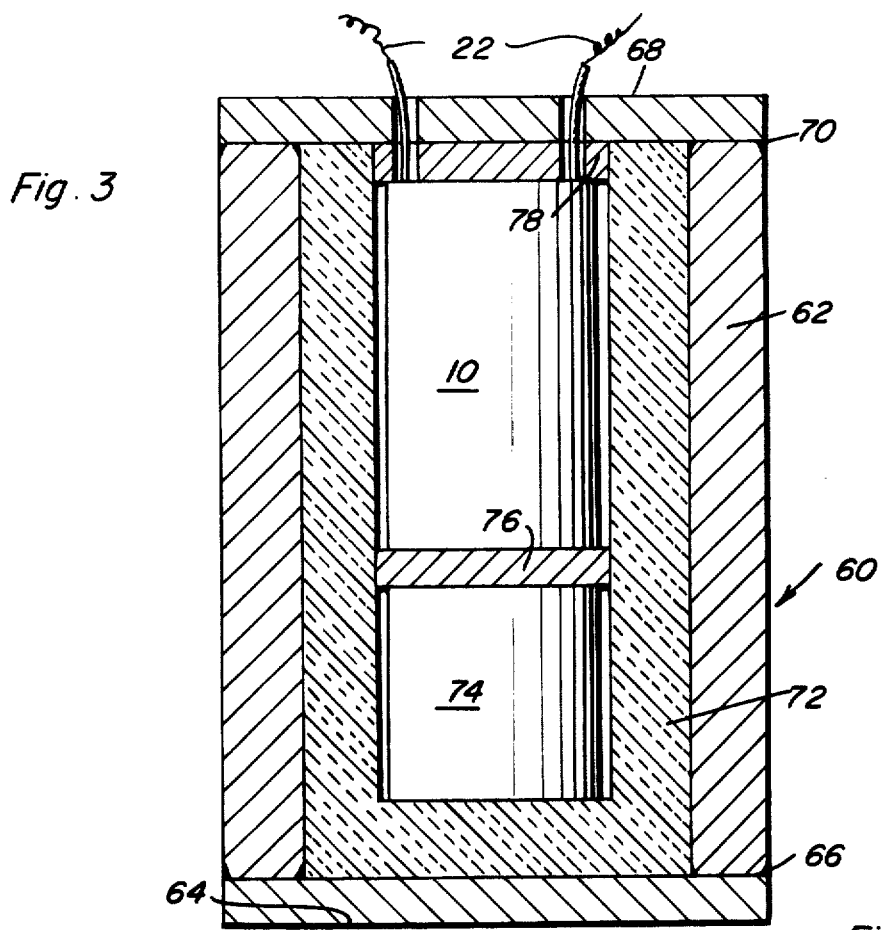
FIG. 3 is a schematic vertical, cross-sectional view of a microwatt thermoelectric generator utilizing the thermopile of the present invention.

Referring now to FIG. 3, microwatt thermoelectric generator 60 comprises a cylindrical outer casing 62 which is closed at one end by means of plate 64 through the intermediary of a weld joint 66 and at its other end by means of closure plate 68 by means of weld joint 70. Generator 60 also includes an insulation layer 72 of conventional design. Located within insulation layer 72 is a nuclear source 74 containing a small quantity of plutonium oxide for example. Outer casing 62 also houses thermopile 10 shown in FIG. 1 having a hot plate 76 at one end and a cold plate 78 at the other end, both of which are insulated from the thermopile by an oxide coating or the like as described in the commonly assigned application cross-referenced above. Leads 22 from thermopile 10 lead through cold plate 78 and closure plate 68 in conventional manner. With this arrangement, a microwatt thermoelectric generator is provided having a thermopile with from about 120 to 720 semiconductive thermoelectric elements connected in series and which is capable of an electric power output of 500 microwatts at approximately 6 volts by using a nuclear power source equivalent to approximately 90 milliwatts of thermal energy.

Figure 4:
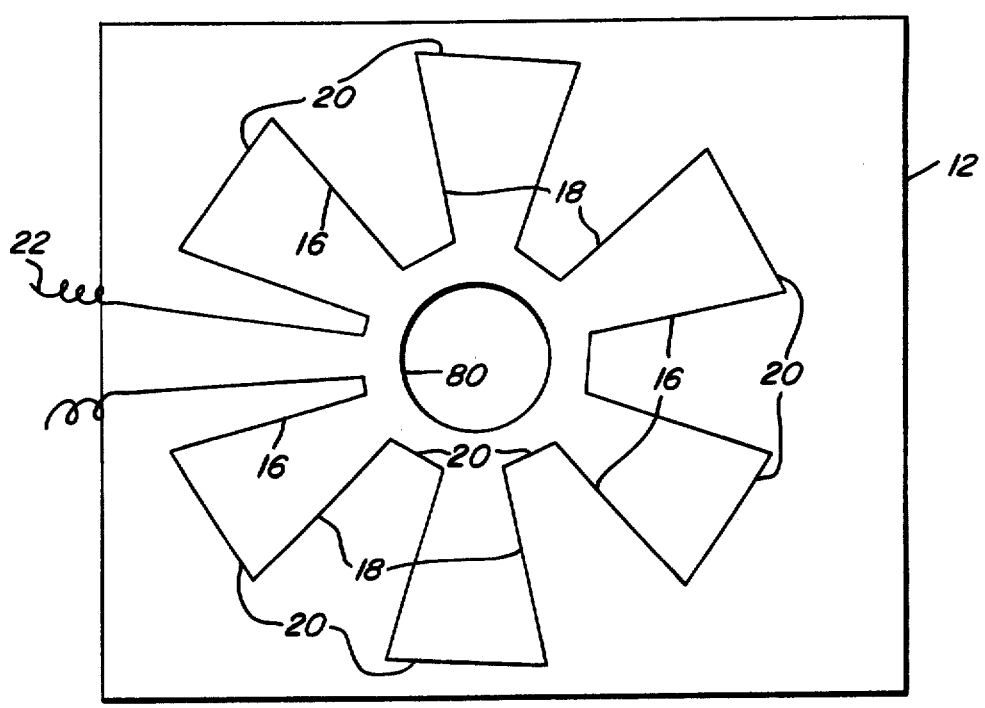
FIG. 4 is a schematic top plan view of another embodiment of the thermopile assembly of the present invention.

FIG. 4 shows another embodiment of the thermopile assembly of the present invention. In this embodiment the P- and N- type bismuth telluride strips 16 and 18, respectively, and the nickel shoes 20 are deposited by sputtering on a polyimide film substrate 12 such as described above. However, thermoelectric elements 14 are arranged to extend radially outwardly from the center of substrate 12. In this arrangement, an aperture or hole 80 is provided in the center of substrate 12 through which a nuclear source 74 can be inserted.

Although the present invention has been described with reference to several preferred embodiments, various changes and modifications will be evident to those skilled in the art including other configurations of the thermopile elements. For example, semiconductor thermoelectric elements 14 can comprise P- and N- type lead telluride strips as well as strips formed from other materials. Also, substrate 12 can be formed from metal such as a 0.3 to 0.5 mil thick cylindrical nickel substrate on which has been deposited an alumina insulation layer by sputtering or the like. Furthermore, the semiconductor thermoelectric elements 14 can be connected in parallel or in any manner desired. Accordingly, the present invention should not be limited by the preferred embodiments illustrated but only as described in the appended claims.

We claim:

1. A thermopile assembly comprising a substrate and thin film thermopile means bonded to said substrate by sputtering, said thermopile means including a plurality of semiconductor thermoelectric elements, said thermopile assembly having been annealed at 250 to 450° C after said thermopile means is bonded to said substrate by sputtering.

2. The thermopile assembly of claim 1 in which said plurality of semiconductor thermoelectric elements comprise a plurality of P- and N- type bismuth telluride elements connected in series.

3. The thermopile assembly of claim 1 in which said substrate is composed of an insulated metal.

4. The thermopile assembly of claim 1 in which said substrate is a plastic film.

5. The thermopile assembly of claim 1 in which said thermopile assembly has been heat treated for 2 to 18 hours.

6. In a microwatt thermoelectric generator including a nuclear source and a thermopile assembly, the improvement in which said thermopile assembly comprises a substrate and thin film thermopile means bonded to said substrate by sputtering, said thermopile means including a plurality of semiconductor thermoelectric elements, said thermopile assembly having been annealed at 250° to 450° C after said thermopile means is bonded to said substrate by sputtering.

7. The microwatt thermoelectric generator of claim 6 in which said plurality of semiconductor thermoelectric elements comprise a plurality of P- and N- type bismuth telluride elements connected in series.

8. The microwatt thermoelectric generator of claim 7 in which said P- and N- type bismuth telluride elements are bonded on said substrate by sputtering.

9. The microwatt thermoelectric generator of claim 6 in which said substrate is a polyimide film.

10. The microwatt thermoelectric generator of claim 6 in which said thermopile means defines a plurality of hot junctions near one side of said substrate and a plurality of cold junctions near a second side of said substrate.

11. The microwatt thermoelectric generator of claim 6 in which said thermopile means defines a plurality of hot junctions spaced radially apart near the center of said substrate and a plurality of cold junctions places radially apart and surrounding said hot junctions.

* * * * *